United States Patent
Nakayama

(10) Patent No.: US 8,133,528 B2
(45) Date of Patent: Mar. 13, 2012

(54) ELECTRON GUN EVAPORATION APPARATUS AND FILM FORMATION METHOD USING THE ELECTRON GUN EVAPORATION APPARATUS

(75) Inventor: Masato Nakayama, Kawagoe (JP)

(73) Assignee: Canon Anelva Corporation, Kawasaki-shi (JP)

( * ) Notice: Subject to any disclaimer, the term of this patent is extended or adjusted under 35 U.S.C. 154(b) by 515 days.

(21) Appl. No.: 12/438,452

(22) PCT Filed: Jan. 29, 2008

(86) PCT No.: PCT/JP2008/051311
§ 371 (c)(1),
(2), (4) Date: Feb. 23, 2009

(87) PCT Pub. No.: WO2008/093676
PCT Pub. Date: Aug. 7, 2008

(65) Prior Publication Data
US 2010/0247807 A1     Sep. 30, 2010

(30) Foreign Application Priority Data
Jan. 30, 2007     (JP) .................................. 2007-018694

(51) Int. Cl.
B05C 11/10     (2006.01)

(52) U.S. Cl. ........... 427/10; 427/8; 427/427.2; 427/585; 118/665; 118/688; 118/713; 118/726

(58) Field of Classification Search .................. 427/8, 9, 427/10, 585, 427.2; 118/665, 713, 726, 688
See application file for complete search history.

(56) References Cited

U.S. PATENT DOCUMENTS 7,479,632 B1 *   1/2009   Gevelber et al. .............. 250/307

FOREIGN PATENT DOCUMENTS

| JP | 60-046367 | 3/1985 |
| JP | 62-089825 | 4/1987 |
| JP | 62-089826 | 4/1987 |
| JP | 62-089829 | 4/1987 |
| JP | 11-200018 | 7/1999 |

* cited by examiner

Primary Examiner — George Koch
(74) Attorney, Agent, or Firm — Fitzpatrick, Cella, Harper & Scinto

(57) ABSTRACT

An electron gun evaporation apparatus capable of efficiently using an evaporation source includes an electron beam position controller which determines, as an applicable range, a range within which the distribution of the film thickness growth rate is almost constant in each scanning direction of an electron beam to be applied to an evaporation source in a crucible for the irradiation position of the electron beam, on the basis of information pertaining to the electron beam irradiation position and the film thickness growth rate in the electron beam irradiation position.

4 Claims, 4 Drawing Sheets

ELECTRON GUN EVAPORATION APPARATUS AND FILM FORMATION METHOD USING THE ELECTRON GUN EVAPORATION APPARATUS

This application is a national stage entry of PCT/JP2008/051311 filed Jan. 29, 2008.

TECHNICAL FIELD

The present invention relates to an electron gun evaporation apparatus which forms a metal film and the like on a semiconductor wafer and electronic part substrate by using an electron gun. The present invention particularly relates to an electron gun evaporation apparatus including an electron beam position controller for controlling and limiting the application range of an electron beam to be applied to an evaporation source in a crucible in order to increase the use efficiency of the evaporation source, and a film formation method using the electron gun evaporation apparatus.

BACKGROUND ART

Electron gun evaporation apparatuses are extensively used in various fields of industries as apparatuses for forming films on the surfaces of objects. Especially in the manufacture of various electronic parts such as a magnetic head and magnetic disk, electron gun evaporation apparatuses are often used to form various conductive films and insulating films.

An outline of the arrangement of a conventional electron gun evaporation apparatus will be explained below with reference to FIG. 4.

An electron gun 6 comprising an electron beam generator 61, electron gun scanning coil 62, and crucible 63 is placed in the lower portion of a vacuum chamber 1 that can be evacuated. The apparatus also includes a film thickness controller 13 for detecting and controlling the film thickness growth rate of a film formed on a substrate 3 placed in the vacuum chamber 1. The apparatus further comprises an electron gun power supply 10 for supplying a high voltage to the electron beam generator 61, a filament controller 11 for controlling the filament power of the electron beam generator 61, a sweep controller (SWEEP controller) 12 for controlling the position of an electron beam that impinges on an evaporation source 7 in the crucible by supplying a direct current to the electron gun scanning coil 62, and an apparatus controller 14 for controlling the electron gun apparatus.

The filament controller 11 installed outside the vacuum chamber 1 supplies electric power to the filament of the electron beam generator 61, thereby turning on the filament. The filament controller 11 supplies a high negative DC voltage (−6 to −10 kV) to the electron beam generator 61 to generate an electron beam.

An evacuating means 2 evacuates the vacuum chamber 1 to a vacuum degree of 1.0E-4 to 1.0E-6 Pa. A substrate holder 4 on which the substrate 3 is placed is installed in the upper portion of the vacuum chamber 1, and a film thickness sensor 5 for monitoring the film thickness is installed below the substrate holder 4. The film thickness controller 13 is connected to the film thickness sensor 5. The film thickness controller 13 can detect the film thickness growth rate of a film formed on the substrate 3 on the basis of that film thickness of the film formed on the substrate 3 which is measured by the film thickness sensor 5.

The electron beam generator 61 of the electron gun 6 generates an electron beam by receiving the high negative DC voltage (−6 to −10 kV) supplied from the electron gun power supply 10. The electron gun scanning coil 62 deflects the electron beam generated by the electron beam generator 61 through about 180°, and controls the electron beam irradiation position. The crucible 63 is a receiver for the evaporation source 7 for film formation. The crucible 63 itself is cooled by a cooling mechanism.

The process of forming a film on the substrate 3 placed on the substrate holder 4 by using the conventional electron gun evaporation apparatus having the above arrangement will be explained below.

While the interior of the vacuum chamber 1 is at the atmospheric pressure, the substrate 3 is placed on the substrate holder 4, and the evaporation source 7 is supplied to the crucible 63. When these preparations are completed, the vacuum chamber 1 is closed, and the evacuating means 2 evacuates the vacuum chamber 1 (until the vacuum degree reaches 1.0E-4 Pa). When this evacuation is completed, cooling water is supplied to the cooling mechanism for cooling the crucible 63, and the electron gun power supply 10 is operated to apply a set negative DC voltage. The applied voltage is −6 to −10 kV.

When the high voltage is completely set, a predetermined emission current value is set by monitoring an emission current meter. The value of the emission current increases in proportion to the electric power applied to the filament. When the emission current flows, the electron beam generator 61 applies an electron beam to the evaporation source 7 in the crucible 63, and this electron beam heats the evaporation source 7. The electric power of this electron beam is the product of the applied voltage and emission current of the electron beam generator 61.

Generally, if the electron gun applied voltage is 6 kV and the emission current is 1 A when evaporating an Al material, the electron beam power is 6 kW. When the electron beam impinges on the evaporation source 7 after that, the evaporation source 7 is heated to a high temperature and starts evaporating, and an evaporated film adheres to the substrate 3 placed on the substrate holder 4. When a predetermined film thickness has adhered to the substrate 3, the power supply to the filament is stopped, so the emission current becomes zero.

When the emission current becomes zero, the power of the electron beam also becomes zero, so the application of the electron beam to the evaporation source 7 stops.

The film thickness sensor 5 measures the film thickness on the substrate 3. On the basis of the measurement result from the film thickness sensor 5, the film thickness controller 13 connected to the film thickness sensor 5 calculates the film thickness growth rate during film formation, and calculates a film formation time required to obtain a predetermined film thickness by using the following equation, thereby managing the film formation time. By thus managing the film formation time, the film thickness controller 13 controls film formation for forming the predetermined film thickness on the substrate 3.

(Film thickness of substrate 3)/(film thickness growth rate)=film formation time When the film having the predetermined film thickness is completely formed, the application of the voltage is stopped by stopping the electron gun power supply 10, thereby completing the film formation process.

In some conventional electron gun evaporation apparatuses, however, the evaporation source supplied into the crucible does not uniformly and evenly reduce because the electron beam spot of the electron gun, that is, the irradiation position of the electron beam is fixed.

To make the reduction of the evaporation source uniform and even, therefore, a method of averagely evaporating the evaporation source by scanning the electron beam irradiation position in the X- and Y-axis directions has been proposed (patent reference 1).

Patent reference 1: Japanese Patent Laid-Open No. 11-200018

DISCLOSURE OF INVENTION

Problems that the Invention is to Solve

Unfortunately, the evaporation source in the crucible does not uniformly evaporate in accordance with the electron beam irradiation position.

FIG. 2 is a view schematically showing the relationship between the electron beam irradiation position in the X-axis direction on the evaporation source in the crucible and the film thickness growth rate on the substrate. A and B in FIG. 2 indicate examples of the loci of sweep when the electron beam irradiation position is changed in the Y-axis direction. FIG. 2 shows that the distribution of the film thickness growth rate when the irradiation position is changed in the X-axis direction on the evaporation source in the crucible includes a portion a in which the film thickness growth rate evenly distributes from the center to the edge of the crucible in the radial direction, and a portion b in which the film thickness growth rate abruptly decreases at the edge of the crucible in the radial direction. This tendency similarly applies to the locus of sweep in the Y-axis direction perpendicular to the X-axis.

The film growth rate decreases in the portion b because the crucible is made of a copper material having a high thermal conductivity, and channels through which cooling water flows are formed inside the crucible and the crucible itself is always cooled to a low temperature. Even when the electron beam impinges on the crucible itself for a short time (a few seconds), therefore, the evaporation source does not evaporate from the crucible, so the film thickness growth rate significantly decreases.

In the conventional method of averagely evaporating the evaporation source by scanning the conventional electron beam irradiation position in the X- and Y-axis directions in order to avoid the difference between the film thickness growth rates in the electron beam irradiation positions as described above, the widths of scanning of the electron beam irradiation position in the X- and Y-axis directions are set within a narrow range by taking account of safety so as not to extend the irradiation position to the crucible outside the evaporation source.

Accordingly, only a portion near the center of the evaporation source is used, and the evaporation source must be replaced although the edge close to the inner wall of the crucible is not used up. That is, the evaporation source must be replaced when 30% to 40% of the whole amount is used, and this decreases the use efficiency of the evaporation source. Especially when using an expensive material such as gold or silver as the evaporation source, a low use efficiency of the evaporation source is a large economical burden.

The present invention has been made in consideration of the above problems, and has as its object to provide an evaporation technique capable of applying an electron beam over a broad range to an evaporation source placed in a crucible, thereby increasing the use efficiency of the evaporation source.

Means of Solving the Problems

To achieve the above object, an electron gun evaporation apparatus according to the present invention is an electron gun evaporation apparatus including, in a vacuum chamber configured to be evacuated, an electron gun which generates an electron beam by accelerating thermions generated from a filament by applying a voltage to the thermions, a film thickness controller which detects a film thickness growth rate of an evaporated film formed on a substrate by applying the electron beam to an evaporation source and evaporating the evaporation source by heat, and a sweep controller which controls an irradiation position of the electron beam on the evaporation source, comprising electron beam position control means for acquiring information concerning an irradiation position of the electron beam from the sweep controller, and information concerning a film thickness growth rate corresponding to the irradiation position from the film thickness controller, determining an applicable range within which the electron beam can be applied to the evaporation source, and storing the applicable range.

Also, a film formation method using an electron gun evaporation apparatus is a film formation method using an electron gun evaporation apparatus including, in a vacuum chamber configured to be evacuated, an electron gun which generates an electron beam by accelerating thermions generated from a filament by applying a voltage to the thermions, a film thickness controller which detects a film thickness growth rate of an evaporated film formed on a substrate by applying the electron beam to an evaporation source and evaporating the evaporation source by heat, and a sweep controller which controls an irradiation position of the electron beam on the evaporation source, the film formation method using the electron gun evaporation apparatus comprises an acquisition step of acquiring information concerning an irradiation position of the electron beam from the sweep controller, and information concerning a film thickness growth rate corresponding to the irradiation position from the film thickness controller, an electron beam position control step of determining an applicable range within which the electron beam can be applied to the evaporation source, on the basis of the information concerning an irradiation position of the electron beam, and the information concerning a film thickness growth rate corresponding to the irradiation position, and storing the applicable range in a memory, and an evaporation step of depositing an evaporated film on the substrate by applying the electron beam to the evaporation source and evaporating the evaporation source by heat, within the applicable range determined in the electron beam position control step.

Effect of the Invention

According to the present invention, it is possible to apply an electron beam over a broad range to an evaporation source placed in a crucible, thereby increasing the use efficiency of the evaporation source.

BRIEF DESCRIPTION OF DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

A preferred embodiment of the present invention will be exemplarily explained in detail below with reference to the accompanying drawings. Note that constituent elements described in this embodiment are merely examples, and the technical scope of the present invention is defined by the scope of the appended claims and is not limited by the following individual embodiment.

Figure 1:
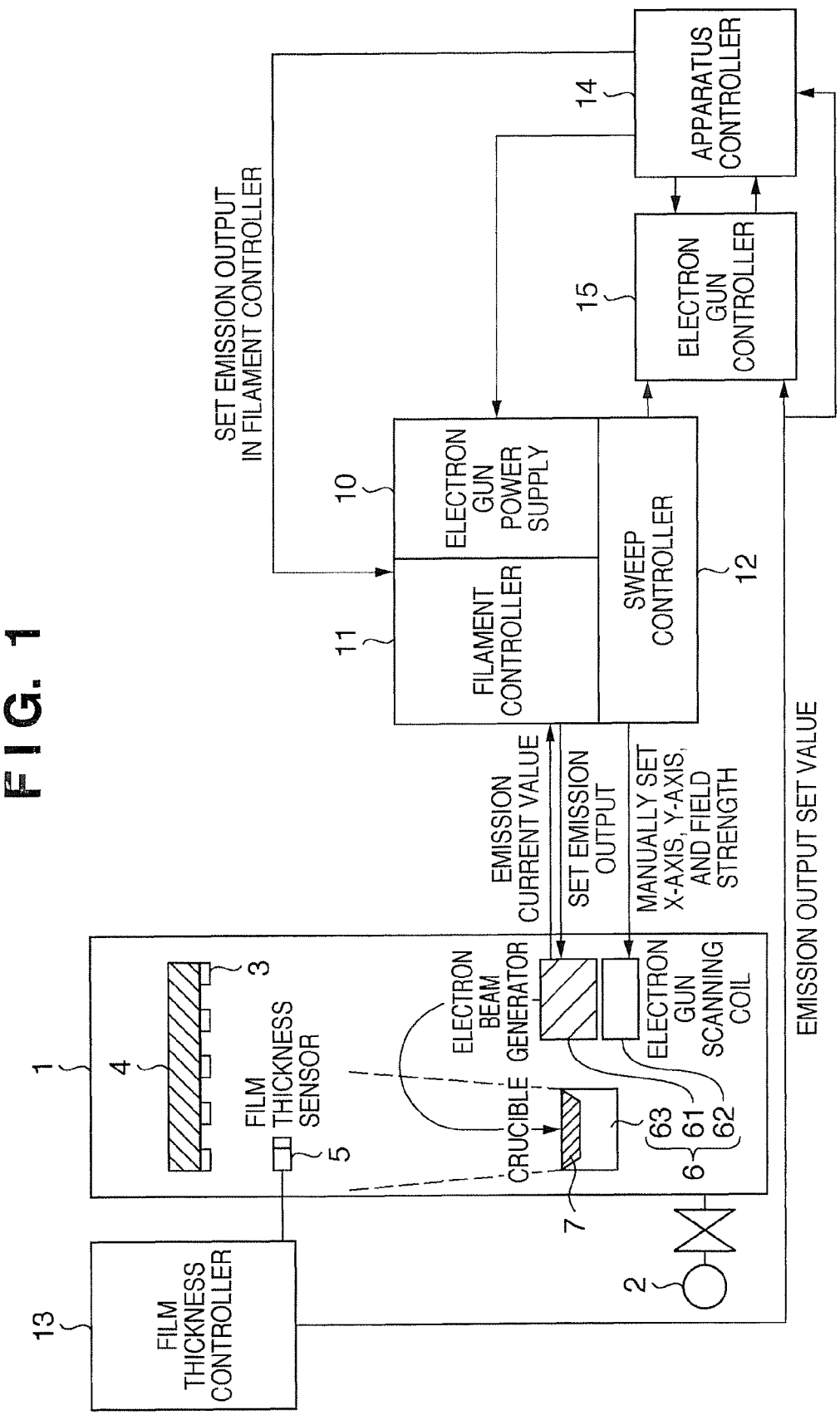
FIG. 1 is a view showing an outline of the arrangement of an electron gun evaporation apparatus according to an embodiment of the present invention.
Figure 4:
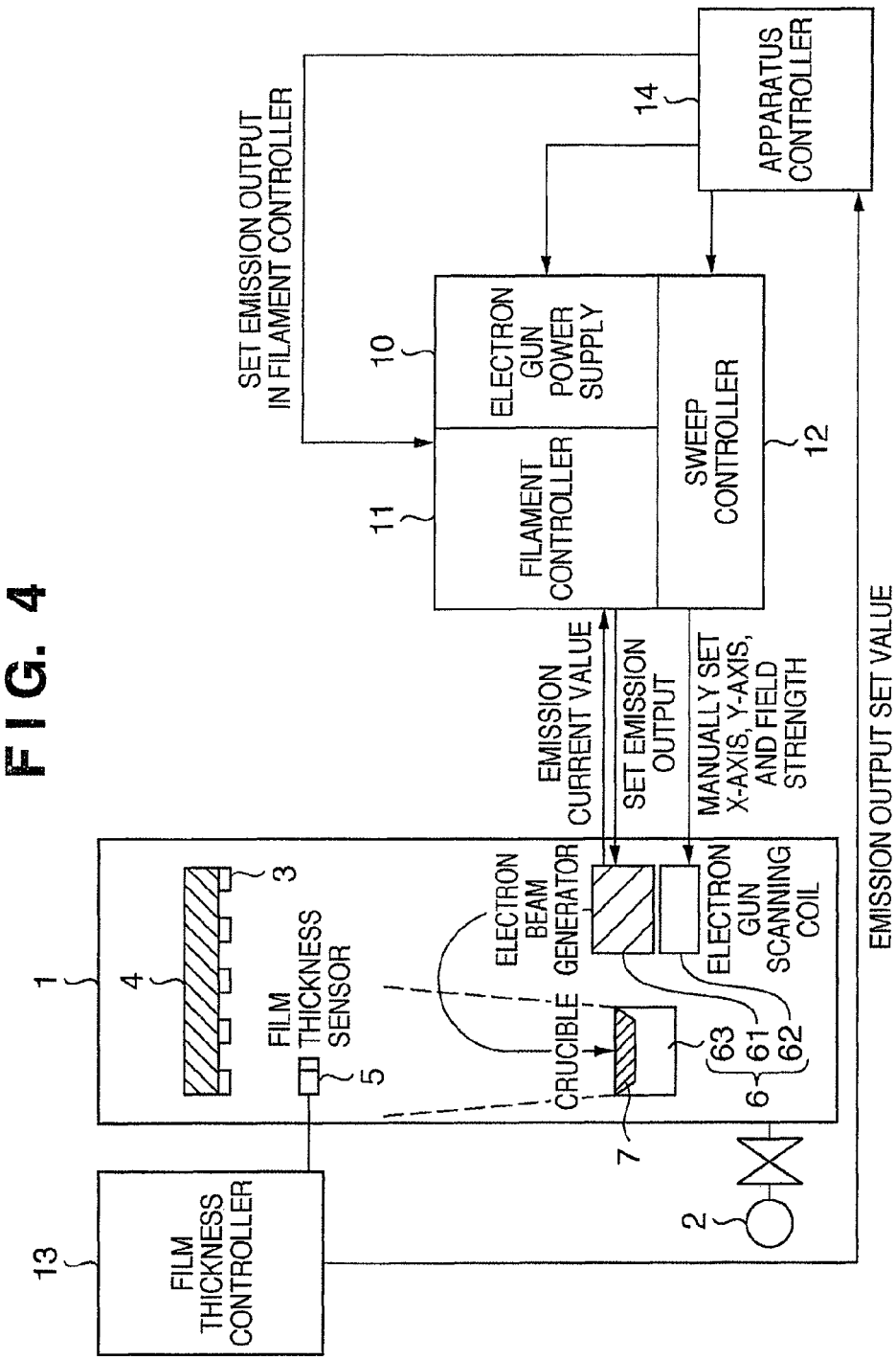
FIG. 4 is a view showing an outline of the arrangement of a conventional electron gun evaporation apparatus.

FIG. 1 is a view showing an outline of the arrangement of an electron gun evaporation apparatus of the present invention. In the following explanation, the same reference numerals as in the conventional electron gun evaporation apparatus explained with reference to FIG. 4 denote the same constituent elements, and a repetitive explanation will be omitted.

First, during the installation or periodical maintenance of the electron gun evaporation apparatus, an electron gun controller 15 functioning as an electron beam position control means presets a sweepable use range (the application range of an electron beam to be applied to an evaporation source) as follows.

The sweepable use range can be determined by operating a sweep controller 12, film thickness controller 13, and film thickness sensor 5. For example, the sweep controller 12 controls the electron beam irradiation position in the X- and Y-axis directions, and the film thickness controller 13 monitors the film thickness growth rate in each irradiation position, and detects the film thickness growth rate in the internal plane of a crucible 63. On the basis of the measurement results, the electron gun controller 15 determines the sweepable use range.

Figure 3:
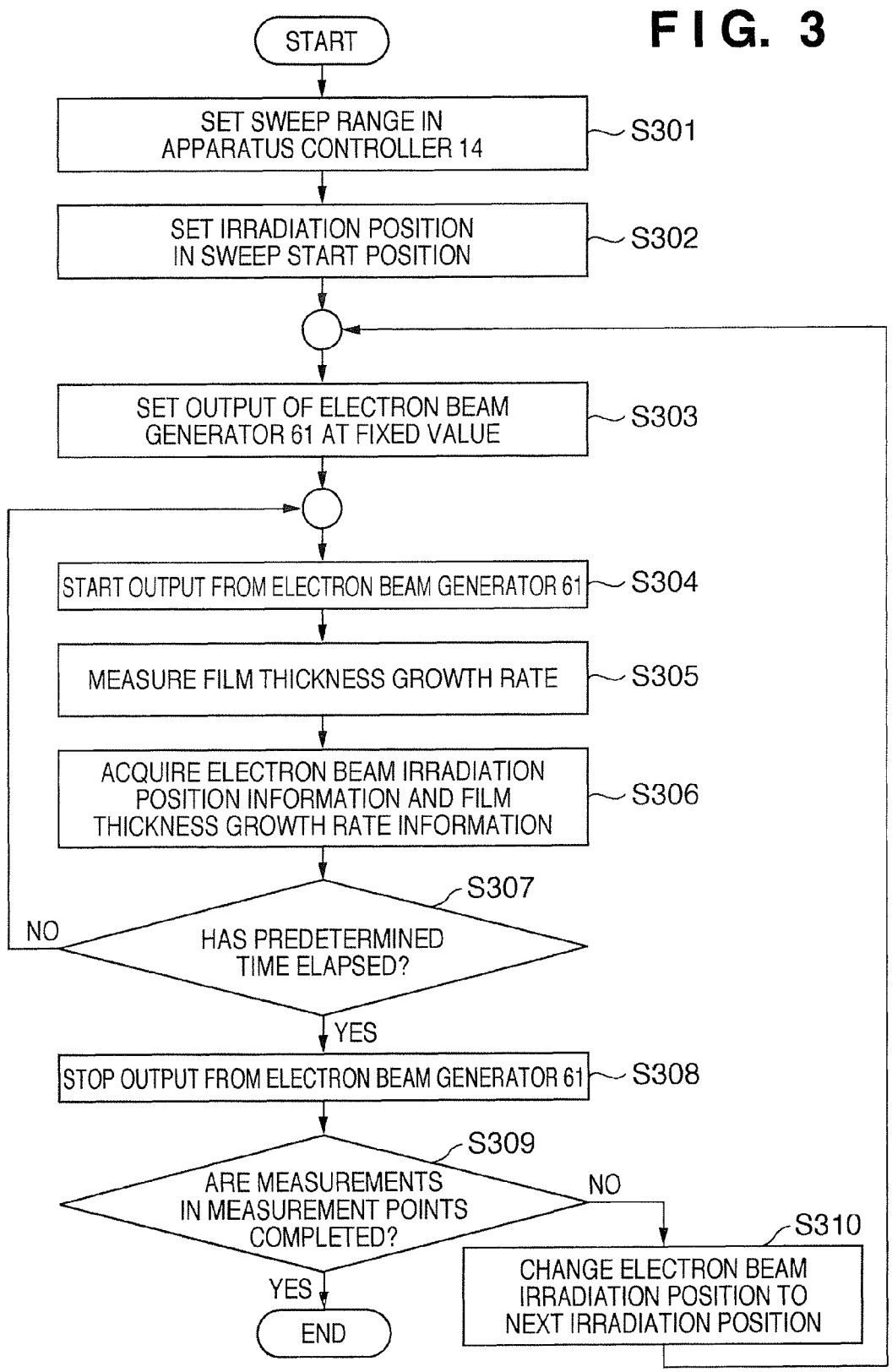
FIG. 3 is a flowchart for explaining the procedure of the process of determining the application range of an electron beam to be applied to an evaporation source, on the basis of the relationships between the scanning positions in the X and Y directions and the corresponding film thickness growth rates.

FIG. 3 is a flowchart for explaining the procedure of the process of determining the range (applicable range) within which the electron beam to be applied to the evaporation source can be applied, on the basis of the relationships between the scanning positions in the X and Y directions and the corresponding film thickness growth rates.

In step S301, the range and number of measurement points of an evaporation source 7 in the crucible 63 are set in an apparatus controller 14 as the electron beam application range (sweep range).

In step S302, the sweep controller 12 sets the irradiation position in a position (sweep start position) where electron beam application is started.

In step S303, the sweep controller 12 makes preparations to enable electron beam application, and sets the output of an electron beam to be emitted by an electron beam generator 61 at a fixed value. The sweep controller 12 applies a high voltage to the electron beam generator 61. After that, a filament power is input, and an emission current is supplied, thereby supplying a predetermined electron beam power. At the same time, the film thickness sensor 5 and film thickness controller 13 are operated and made enable to monitor the film thickness growth rate.

In step S304, the electron beam generator 61 starts outputting an electron beam under the control of the sweep controller 12.

In step S305, the film thickness controller 13 measures the film thickness growth rate on the basis of the measurement result from the film thickness sensor 5.

In step S306, the electron gun controller 15 acquires information concerning the electron beam irradiation position from the sweep controller 12, and information concerning the film thickness growth rate corresponding to the electron beam irradiation position from the film thickness controller 13, and stores these pieces of information in a memory of the electron gun controller 15 (an acquisition step).

In step S307, the sweep controller 12 determines whether a predetermined time has elapsed from the start of electron beam emission. If the predetermined time has not elapsed (NO in S307), the sweep controller 12 returns the process to step S304, and repeats the same processing. On the other hand, if it is determined in step S307 that the predetermined time has elapsed, the sweep controller 12 advances the process to step S308.

In step S308, the electron beam generator 61 stops outputting the electron beam under the control of the sweep controller 12. In step S309, the apparatus controller 14 determines whether the measurement is completely performed in all the measurement points within the set sweep range. If not all the measurements are completed in the sweep range set in step S301 (NO in S309), the apparatus controller 14 advances the process to step S310.

In step S310, the sweep controller 12 changes the electron beam irradiation position to the next irradiation position, and repeats the processing from step S303.

The electron gun controller 15 acquires the irradiation position (X-axis irradiation position) in the X-axis direction output from the sweep controller 12 and the film thickness growth rate information in the X-axis irradiation position monitored by the film thickness controller 13, and stores these pieces of information in the internal memory of the electron gun controller 15. Then, the sweep controller 12 controls the electron beam emitted from the electron beam generator 61 in the Y-axis direction, and the film thickness controller 13 monitors the film thickness growth rate in the irradiation position (Y-axis irradiation position) in the Y-axis direction by the film thickness controller 13. The electron gun controller 15 acquires the Y-axis irradiation position output from the sweep controller 12 and the film thickness growth rate information in the Y-axis irradiation position monitored by the film thickness controller 13, and stores these pieces of information in the internal memory of the electron gun controller 15.

In step S309, the apparatus controller 14 terminates the process if all the measurements within the entire sweep range set in step S301 are completed (YES in S309).

Figure 2:
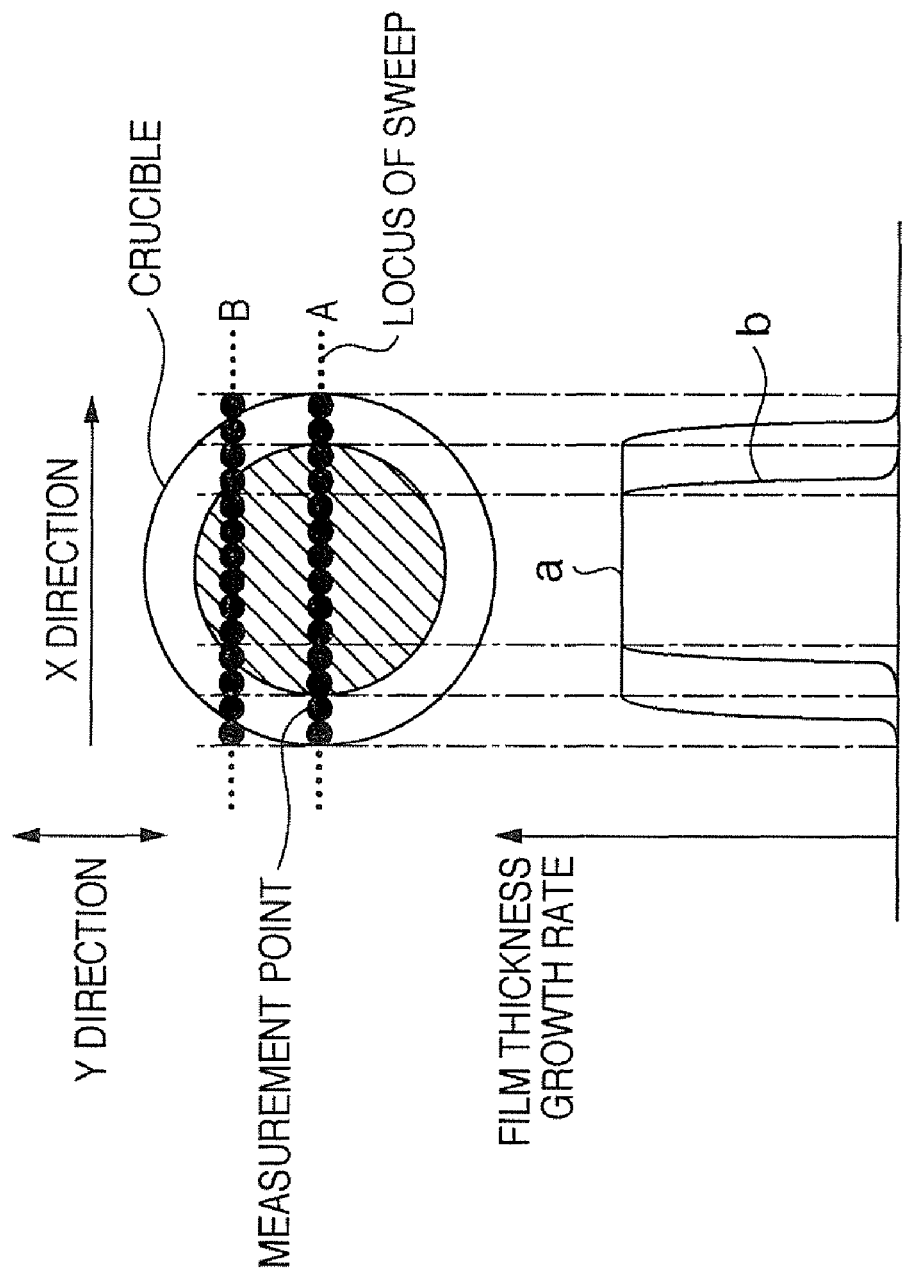
FIG. 2 is a view showing an example of the relationship between the X-axis sweep and film thickness growth rate of the electron gun evaporation apparatus.

On the basis of the film thickness growth rates corresponding to the X- and Y-axis irradiation positions and stored in the memory, the electron gun controller 15 determines the range within which the distribution of the film thickness growth rate is almost constant in each scanning direction of the electron beam as the range (applicable range) within which the electron beam can be applied (an electron beam position control step). For example, the electron gun controller 15 determines the application range in the X and Y directions within which the film thickness growth rate corresponding to the portion a shown in FIG. 2 has an almost constant distribution. In this determination, the electron gun controller 15 can determine the application range of the film thickness growth rate within a predetermined reference range as the application range that gives an almost constant film thickness growth rate distribution, by comparing the film thickness growth rate in each irradiation position in the X- and Y-axis directions with the reference range.

By performing the above operation, the electron beam sweepable use range based on the film thickness growth rate, that is, the application range of the electron beam to be applied to the evaporation source is determined, and stored in the memory of the electron gun controller 15.

Also, the electron beam scanning position and the film thickness growth rate on the substrate are such that the film thickness growth rates in the electron beam irradiation positions stored in the electron gun controller 15 are equal for the same evaporation process (e.g., the material and shape of the crucible and the material of the evaporation source). Therefore, even when the evaporation process is changed to an evaporation process different in, for example, the material of the crucible and the type and capacity of the evaporation source, the electron beam application range (sweepable use range) can be determined for a different kind of evaporation source if information pertaining to the corresponding film thickness growth rate is stored. Accordingly, the evaporation source can be used at high efficiency of use.

This obviates the need to limit the scanning widths (application range) of the electron beam spot in the X- and Y-axis directions to a narrow range by taking safety into account, unlike in the conventional apparatus. Therefore, it is possible to apply the electron beam over a wide range to the evaporation source 7, and increase the efficiency of use of the evaporation source 7 from 30% to 40% as the conventional value to 70% to 80%.

The electron gun controller 15 is connected to the apparatus controller 14 that performs various settings required for the operation of the electron gun evaporation apparatus, for example, the setting of the high voltage of the electron beam generator 61, and the settings of the filament power, emission current, and electron beam sweep range. When actually operating the electron gun evaporation apparatus (FIG. 1) according to the embodiment of the present invention, the apparatus controller 14 presets the high voltage value, filament power or emission current value, and electron beam application range (sweep range) as in the conventional electron gun evaporation apparatus described with reference to FIG. 4. In this case, the electron gun controller 15 compares the sweep range preset by the apparatus controller 14 with the applicable range stored in the memory of the electron gun controller 15.

If the set value of the sweep range set by the apparatus controller 14 has exceeded the electron beam applicable range stored in the memory of the electron gun controller 15 in step S301 of FIG. 3, the electron gun controller 15 controls electron beam application so as not to exceed the applicable range, and performs answerback to notify the apparatus controller 14 that the set value has exceeded the applicable range.

The electron gun controller 15 incorporates an alarm (not shown), and can generate an alarm sound by the alarm if the irradiation position of the electron beam to be applied to the evaporation source 7 in the crucible 63 has exceeded the value of the sweepable use range. It is also possible to separate the alarm from the electron gun controller 15, and allow the apparatus controller 14 to receive a signal indicating that the applicable range is exceeded from the electron gun controller 15, and generate an alarm sound.

If the applicable range of the electron beam to be applied to the evaporation source 7 in the crucible 63 is exceeded, the electron gun controller 15 can also perform an operation of stopping the operation of the electron gun power supply 10 for applying the high voltage to the electron beam generator 61. This makes it possible to stop electron beam application and prevent damages to the crucible 63 and the like if the irradiation position of the electron beam to be applied to the evaporation source 7 in the crucible 63 has exceeded the applicable range.

According to this embodiment, even when the apparatus controller performs the setting exceeding the electron beam applicable range, the electron beam application range can be limited so as not to exceed the applicable range determined by the electron gun controller 15. Since the electron beam application range always exists inside the evaporation source, the electron gun evaporation apparatus can be stably operated.

Also, a film formation method using the electron gun evaporation apparatus shown in FIG. 1 has an acquisition step of acquiring information concerning the irradiation position of the electron beam from the sweep controller 12, and information concerning the film thickness growth rate corresponding to the irradiation position from the film thickness controller 13, an electron beam position control step of determining an applicable range within which the electron beam can be applied to the evaporation source, on the basis of the information concerning the irradiation position of the electron beam, and the information concerning the film thickness growth rate corresponding to the irradiation position, and storing the applicable range in a memory, and an evaporation step of depositing an evaporated film on the substrate by applying the electron beam to the evaporation source and evaporating the evaporation source by heat, within the determined applicable range.

The preferred embodiment of the present invention has been explained with reference to the accompanying drawings. However, the present invention is not limited to the above embodiment and can be changed to various forms within the technical scope grasped from the description of the scope of the appended claims.

The present invention is not limited to the above embodiment and various changes and modifications can be made without departing from the spirit and scope of the invention. Therefore, to apprise the public of the scope of the present invention, the following claims are appended.

This application claims the benefit of Japanese Patent Application No. 2007-018694, filed Jan. 30, 2007, which is hereby incorporated by reference herein in its entirety.

The invention claimed is:

1. An electron gun evaporation apparatus including, in a vacuum chamber configured to be evacuated, an electron gun configured to irradiate an electron beam to an evaporation source and to form a film on a substrate by evaporating the evaporation source by heat of the irradiated electron beam, and electron beam position control means which has a memory and controls said electron gun so as to irradiate the electron beam to a predetermined position of the evaporation source, wherein said electron beam position control means (i) stores, in the memory, information concerning an irradiation position of the electron beam and information concerning a film thickness growth rate corresponding to the irradiation position before the electron gun irradiates the electron beam and the evaporation source is evaporated, and (ii) controls, based on the information stored in the memory, the electron gun so as to irradiate the electron beam for forming the film on the substrate in a range within which a distribution of the film thickness growth rate is substantially constant in a scanning direction of the electron beam.

2. The electron gun evaporation apparatus according to claim 1, wherein if a predetermined electron beam application range has exceeded the applicable range determined by said electron beam position control means, said electron beam position control means controls application of the electron beam such that the applicable range is not exceeded.

3. The electron gun evaporation apparatus according to claim 2, wherein if the predetermined electron beam application range has exceeded the applicable range, said electron beam position control means performs at least one of an operation of performing notification by generating an alarm sound, and an operation of stopping an operation of an electron gun power supply which supplies a high voltage to said electron gun.

4. A film formation method using an electron gun evaporation apparatus including, in a vacuum chamber configured to be evacuated, an electron gun which generates an electron beam by accelerating thermions generated from a filament by applying a voltage to the thermions, a film thickness controller which detects a film thickness growth rate of an evaporated film formed on a substrate by applying the electron beam to an evaporation source and evaporating the evaporation source by heat, and a sweep controller which controls an irradiation position of the electron beam on the evaporation source, the film formation method using the electron gun evaporation apparatus comprises:

an acquisition step of acquiring information concerning an irradiation position of the electron beam from the sweep controller, and information concerning a film thickness growth rate corresponding to the irradiation position from the film thickness controller;

an electron beam position control step of determining an applicable range within which the electron beam can be applied to the evaporation source, on the basis of the information concerning an irradiation position of the electron beam acquired in the acquisition step, and the information concerning a film thickness growth rate corresponding to the irradiation position, and storing the applicable range in a memory; and an evaporation step of depositing an evaporated film on the substrate by applying the electron beam to the evaporation source and evaporating the evaporation source by heat, within the applicable range determined in the electron beam position control step;

wherein in the electron beam position control step, a range within which a distribution of the film thickness growth rate is substantially constant in each scanning direction of the electron beam is determined as the applicable range, on the basis of the information concerning an irradiation position of the electron beam, and the information concerning a film thickness growth rate corresponding to the irradiation position.

* * * * *